(12) United States Patent
Takahashi et al.

(10) Patent No.: US 12,333,166 B2
(45) Date of Patent: Jun. 17, 2025

(54) MEMORY SYSTEM THAT CONTROLS TIMING OF REFRESH OPERATION

(71) Applicant: KIOXIA CORPORATION, Tokyo (JP)

(72) Inventors: Kenji Takahashi, Kawasaki Kanagawa (JP); Makoto Kuribara, Meguro Tokyo (JP); Shin Takasaka, Yokohama Kanagawa (JP); Rintaro Arai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 172 days.

(21) Appl. No.: 17/899,426

(22) Filed: Aug. 30, 2022

(65) Prior Publication Data
US 2023/0315312 A1    Oct. 5, 2023

(30) Foreign Application Priority Data
Mar. 10, 2022 (JP) ................................ 2022-036990

(51) Int. Cl.
*G06F 3/06* (2006.01)
(52) U.S. Cl.
CPC .......... *G06F 3/0632* (2013.01); *G06F 3/0604* (2013.01); *G06F 3/0679* (2013.01)
(58) Field of Classification Search
CPC ...... G11C 7/04; G11C 16/0483; G11C 16/349
See application file for complete search history.

(56) References Cited

U.S. PATENT DOCUMENTS

| 9,817,585 | B1* | 11/2017 | Trachtman | ............ | G06F 3/0685 |
| 11,099,760 | B2 | 8/2021 | Natarajan et al. | | |
| 2009/0228640 | A1 | 9/2009 | Kurashige | | |
| 2014/0059405 | A1* | 2/2014 | Syu | ........ | G11C 16/04 |
| | | | | | 711/E12.008 |
| 2014/0310445 | A1* | 10/2014 | Fitzpatrick | .......... | G06F 12/0246 |
| | | | | | 711/103 |
| 2021/0174886 | A1* | 6/2021 | Prakash | ............. | G11C 16/3418 |

FOREIGN PATENT DOCUMENTS

| JP | 2010-515953 A | 5/2010 |
| JP | 2016-045563 A | 4/2016 |
| JP | 2019-204229 A | 11/2019 |
| WO | 2009/110142 A1 | 9/2009 |

\* cited by examiner

*Primary Examiner* — Hosain T Alam
*Assistant Examiner* — Nicholas A. Paperno
(74) *Attorney, Agent, or Firm* — Kim & Stewart LLP

(57) ABSTRACT

A memory system controls timing of a refresh operation. The memory system includes a non-volatile memory including first and second memory cell units and a controller connectable to a host. The controller stores an execution time of write and erase operations with respect to the first memory cell unit, receives from the host power-on time information indicating a power-on time of the memory system when the memory system is powered on, determines a first time period from a last write or erase operation with respect to the first memory cell unit based on the stored execution time and the power-on time, determines an execution time of the refresh operation of transferring data stored in the first memory cell unit to the second memory cell unit based on the first time period, and starts the refresh operation at the determined execution time.

8 Claims, 17 Drawing Sheets

FIG. 5

| (UNIT· TIME) | PECycle | | | |
|---|---|---|---|---|
| TEMPERATURE | 0~1K | ~2K | ~3K | ... |
| C°C OR MORE | XX | XX | XX | ... |
| B~C°C | XX | XX | XX | ... |
| A~B°C | XX | XX | XX | ... |
| LESS THAN A°C | XX | XX | XX | ... |

FIG. 13
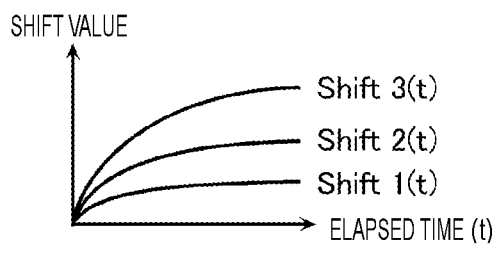
PECycle = X    TEMPERATURE = A
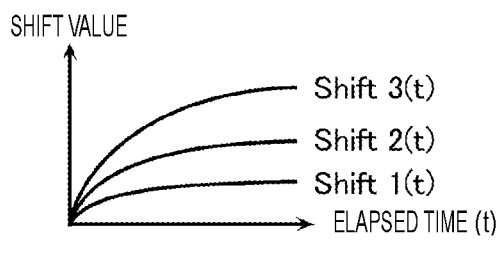
PECycle = Y    TEMPERATURE = A
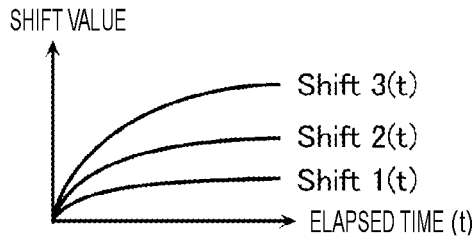
PECycle = X    TEMPERATURE = B
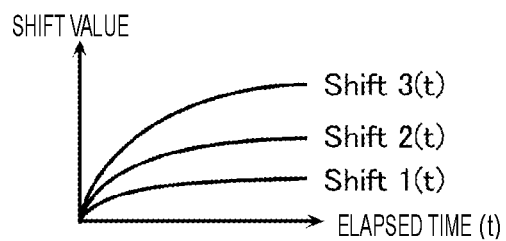
PECycle = Y    TEMPERATURE = B
FIG. 14
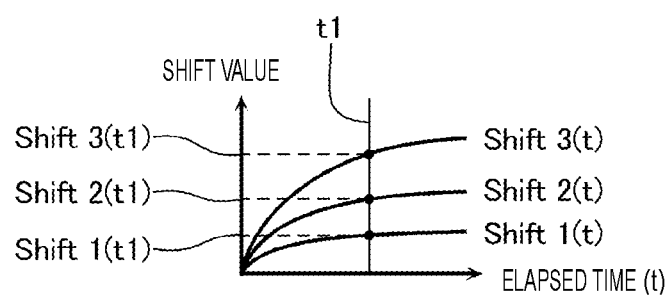
PECycle = X    TEMPERATURE = B FIG. 16
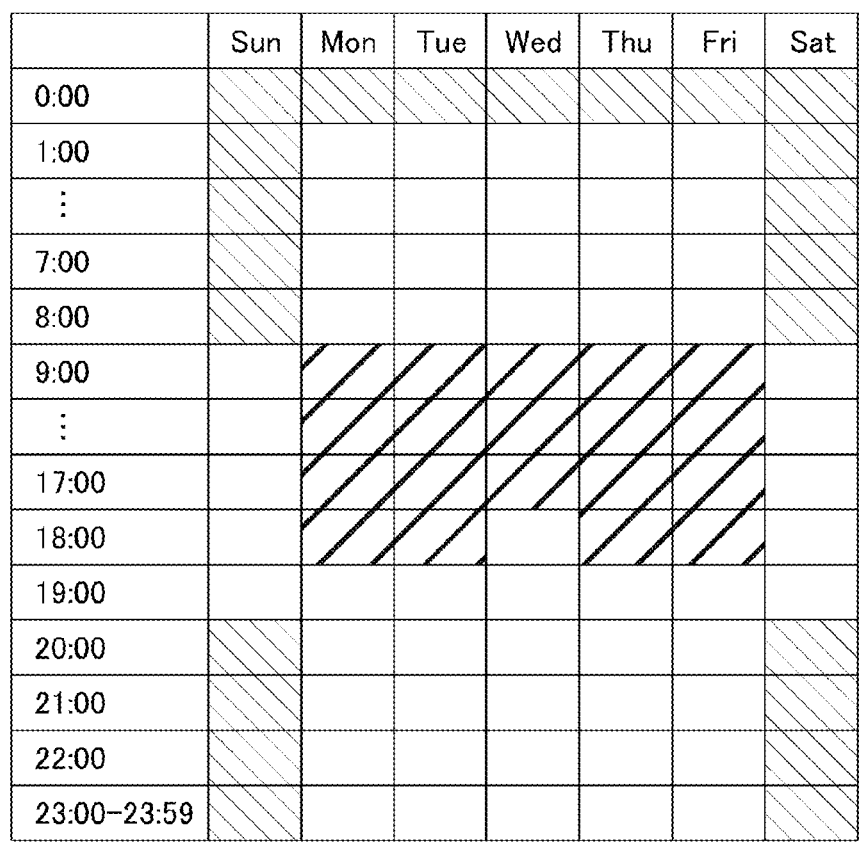
 ALMOST NO INPUT/OUTPUT
 RELATIVELY SMALL INPUT/OUTPUT
 RELATIVELY LARGE INPUT/OUTPUT

MEMORY SYSTEM THAT CONTROLS TIMING OF REFRESH OPERATION

CROSS-REFERENCE TO RELATED APPLICATION(S)

This application is based upon and claims the benefit of priority from Japanese Patent Application No. 2022-036990 filed Mar. 10, 2022, the entire contents of which are incorporated herein by reference.

FIELD

Embodiments described herein relate generally to a memory system and method.

BACKGROUND

A memory system including a non-volatile memory such as a NAND flash memory and a controller connected to the non-volatile memory is known. The memory system may be connected to a host device. The memory system may receive time information from the connected host device.

BRIEF DESCRIPTION OF THE DRAWINGS

FIG. 4 is a block diagram schematically illustrating functional units of a controller and the like.

FIG. 5 is a table to explain a method of adjusting an execution timing of a forced refresh operation.

FIG. 13 is a diagram to explain the method of adjusting the read voltage.

FIG. 14 is another diagram to explain the method of adjusting the read voltage.

FIG. 16 is a table to explain an operation of a memory system according to a fifth embodiment.

DETAILED DESCRIPTION

Embodiments provide a reliable memory system and method.

In general, according to an embodiment, a memory system includes a non-volatile memory including a first memory cell unit and a second memory cell unit, and a controller connectable to a host. The controller is configured to store a value corresponding to an elapsed time from an execution of an erase operation or a write operation with respect to the first memory cell unit, store a power-off time of the memory system when a power of the memory system is powered off, receive from the host power-on time information indicating a power-on time of the memory system when the memory system is powered on, determine a power-off period during which the memory system is being powered off based on the stored power-off time and the power-on time, update the stored value based on a value corresponding to an elapsed time from an execution of a last erase or write operation with respect to the first memory cell unit and the determined power-off period, determine an execution time of a refresh operation of transferring data stored in the first memory cell unit to the second memory cell unit based on the updated value, and start the refresh operation at the determined execution time.

A memory system according to embodiments will be described in detail with reference to the accompanying drawings. The following embodiments are merely examples and are not intended in any way to limit the present disclosure.

First Embodiment

[Memory System 10]

Figure 1:
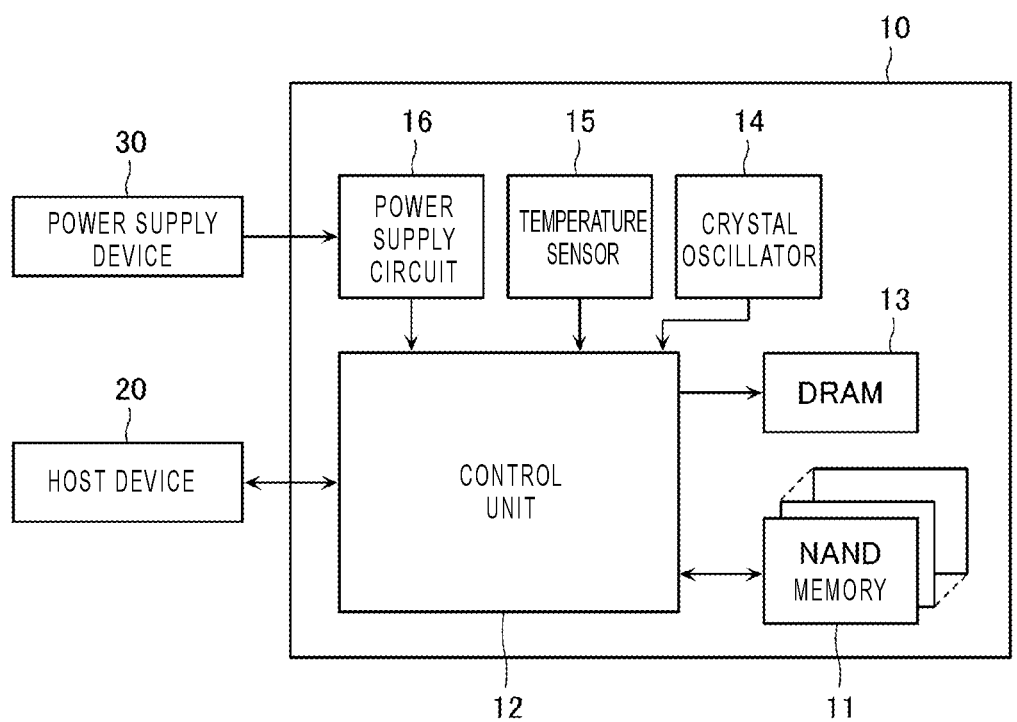
FIG. 1 is a block diagram schematically illustrating a configuration of a memory system according to a first embodiment.

FIG. 1 is a block diagram schematically illustrating a configuration of a memory system 10 according to a first embodiment. The memory system 10 performs a read operation and a write operation according to a signal received from a host device 20. The memory system 10 is, for example, a solid state drive (SSD), a universal flash storage (UFS) device, a memory card, a universal serial bus (USB) memory, or other system capable of storing data.

The memory system 10 includes a plurality of NAND flash memories (as an example of non-volatile memories and hereinafter refer to as NAND memories) 11, a controller 12, a dynamic random access memory (DRAM) 13, a crystal oscillator 14, a temperature sensor 15, and a power supply circuit 16. Each of the plurality of NAND memories 11 stores data. The controller 12 controls the NAND memory 11 in response to an instruction from the host device 20. The controller 12 is, for example, an arithmetic processing circuit such as a central processing unit (CPU) or a micro processing unit (MPU). The controller 12 is configured with, for example, a system on chip (SoC). The DRAM 13 stores data necessary for a read operation and a write operation, and management information of the entire memory system 10. The crystal oscillator 14 generates a clock signal and supplies the clock signal to the controller 12. The temperature sensor 15 generates temperature data and supplies the temperature data to the controller 12. The power supply circuit 16 generates a plurality of types of voltages based on a voltage supplied from a power supply device 30 and supplies the generated voltages to each component of the memory system 10. The power supply device 30 may be integrally configured with the host device 20.

Figure 2:
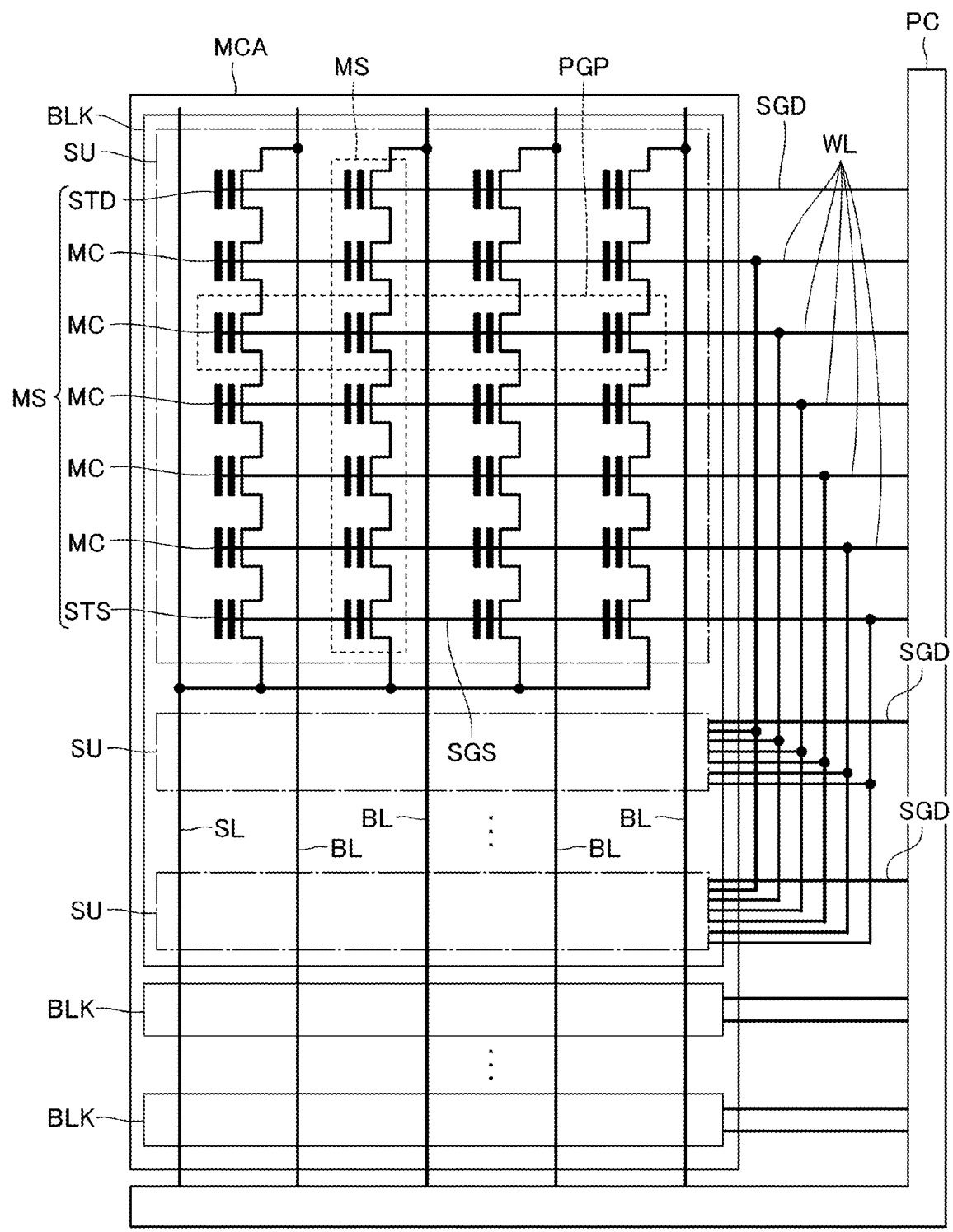
FIG. 2 is a circuit diagram schematically illustrating a configuration of a NAND memory in the memory system.

FIG. 2 is a circuit diagram schematically illustrating a configuration of the NAND memory 11. As illustrated in FIG. 2, the NAND memory 11 includes a memory cell array MCA and a peripheral circuit PC.

The memory cell array MCA includes a plurality of memory blocks BLK. The memory block BLK is an execution unit of an erase operation. Each memory block BLK includes a plurality of string units SU. Each of the plurality of string units SU includes a plurality of memory strings MS. One ends of the plurality of memory strings MS are connected to the peripheral circuit PC via bit lines BL, respectively. Further, the other ends of the plurality of memory strings MS are connected to the peripheral circuit PC via a common source line SL.

The memory string MS includes a drain side select transistor STD connected in series between the bit line BL and the source line SL, a plurality of memory cells MC (may be referred to as memory cell transistors), and a source side select transistor STS. Hereinafter, the drain side select transistor STD and the source side select transistor STS may be simply referred to as a select transistor STD and a select transistor STS, respectively.

The memory cell MC is a field effect transistor including a semiconductor layer, a gate insulating film, and a gate electrode. The semiconductor layer functions as a channel region. The gate insulating film includes a charge storage film. A threshold voltage of the memory cell MC changes according to an amount of charge in the charge storage film. The memory cell MC stores one bit or a plurality of bits of data. Different word lines WL are respectively connected to the gate electrodes of the plurality of memory cells MC of one memory string MS. The word lines WL are respectively connected in common to all memory strings MS in one memory block BLK.

Hereinafter, among a plurality of memory cells MC corresponding to one string unit SU, memory cells connected to the common word line WL may be referred to as a page portion PGP. When each memory cell MC stores 1 bit of data, the page portion PGP stores 1 page of data. When each memory cell MC stores n bit of data, the page portion PGP stores n page of data. A page is an execution unit of the read operation and the write operation.

The select transistors STD and STS are field effect transistors including a semiconductor layer, a gate insulating film, and a gate electrode. The semiconductor layer functions as a channel region. Select gate lines SGD and SGS are connected to the gate electrodes of the select transistors STD and STS, respectively. The drain side select gate line SGD is provided corresponding to the string unit SU and is commonly connected to all memory strings MS in one string unit SU. The source side select gate line SGS is commonly connected to all memory strings MS in the memory block BLK.

Figure 3:
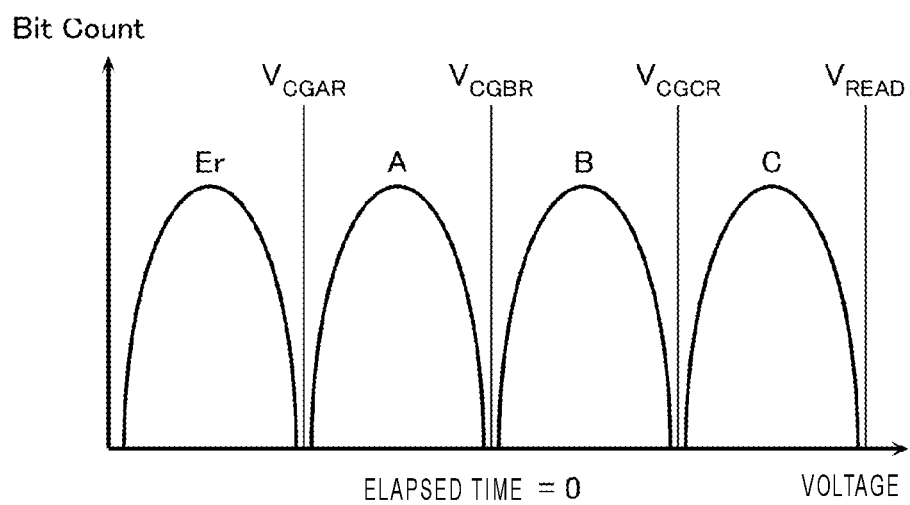
FIG. 3 is a histogram schematically illustrating a threshold voltage distribution of a memory cell.

FIG. 3 is a histogram schematically illustrating a threshold voltage distribution of the memory cell MC. FIG. 3 illustrates the threshold voltages of a plurality of memory cells MC corresponding to the page portion PGP when the each memory cell MC stores 2 bits of data.

When the each memory cell MC stores 2 bits of data, the threshold voltage of the memory cell MC is controlled to be in one of $2^2=4$ states by controlling an amount of charge in the charge storage film in the write operation. For example, the memory cell MC that stores data "1, 1" is controlled to be in the Er state. Similarly, for example, the memory cell MC that stores data "0, 1", "0, 0", and "1, 0" is controlled to be in the A, B, and C states, respectively. The threshold voltage of the memory cell MC in the Er state is smaller than a read voltage $V_{CGAR}$. Further, the threshold voltage of the memory cell MC in the A state is larger than a read voltage $V_{CGAR}$ and smaller than a read voltage $V_{CGBR}$. The threshold voltage of the memory cell MC in the B state is larger than the read voltage $V_{CGBR}$ and smaller than a read voltage $V_{CGCR}$. The threshold voltage of the memory cell MC in the C state is larger than the read voltage $V_{CGCR}$ and smaller than a read path voltage $V_{READ}$.

For example, when reading data of lower bits during the read operation, the read path voltage $V_{READ}$ is supplied to a non-selected word line WL. Further, an ON voltage for turning on the select transistors STD and STS is supplied to the select gate lines SGD and SGS. The read voltage $V_{CGBR}$ is supplied to the selected word line WL, and a current flowing through the bit line BL is sensed. As a result, data indicating the ON/OFF state of the plurality of memory cells MC corresponding to the selected page portion PGP is acquired. Further, the data is output from the NAND memory 11 as read data.

For example, when reading data of higher bits during the read operation, the read path voltage $V_{READ}$ is supplied to the non-selected word line WL. Further, the ON voltage is supplied to the select gate lines SGD and SGS. The read voltage $V_{CGAR}$ is supplied to the selected word line WL, and data indicating the ON/OFF state of the plurality of memory cells MC corresponding to the selected page portion PGP is acquired. Similarly, the read voltage $V_{CGCR}$ is supplied to the selected word line WL, and data indicating the ON/OFF state of the plurality of memory cells MC corresponding to the selected page portion PGP is acquired. Further, an exclusive OR of the data is output from the NAND memory 11 as read data.

Figure 4:
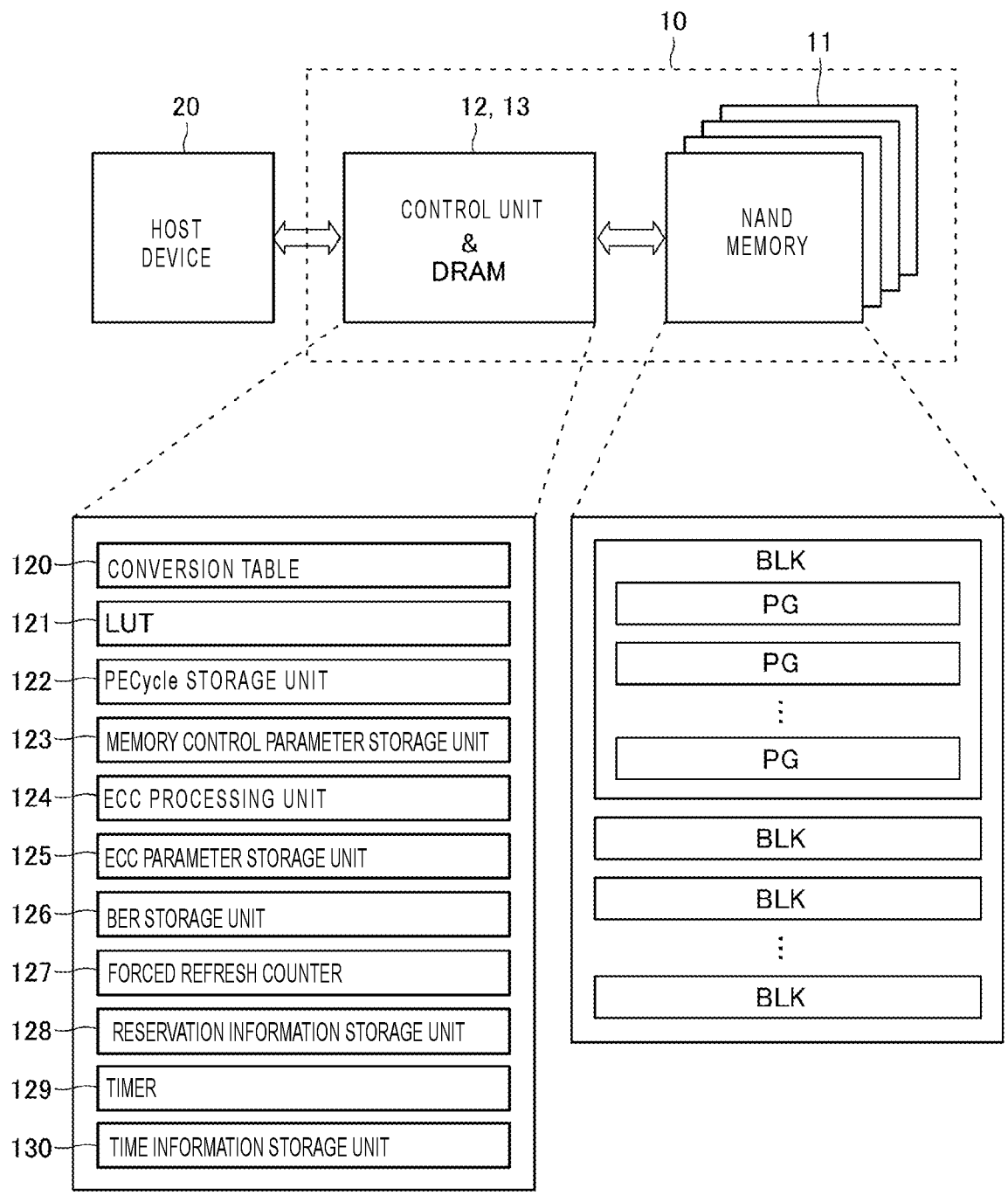

FIG. 4 is a schematic block diagram illustrating functional units of the controller 12 and the like. FIG. 4 also illustrates a configuration of the NAND memory 11 for the sake of explanation. In FIG. 4, a page which is an execution unit of the read operation or the write operation is illustrated as a page PG.

The controller 12 implements various functions together with the DRAM 13 and the like.

The read operation and the write operation are performed inside the memory system 10 in parallel with respect to a plurality of NAND memories 11 for a high speed operation. A set of a plurality of memory blocks BLK selected from the plurality of NAND memories capable of operating in parallel is referred to as a logical block.

A conversion table 120 stores an identification number of a logical block, a logical address representing a position in the logical block, and a physical address assigned to each page PG of the NAND memory 11 in association with each other. During the read operation, a look up table (LUT) 121 (to be described below) and the conversion table 120 are referred to, and the physical address corresponding to the logical address is acquired. During the write operation, the physical address of an "erased" page PG (to be described below) is acquired and stored in the conversion table 120 in association with the logical address.

The look up table (LUT) 121 is a table indicating in which logical address data designated by a logical block address (LBA) from the host device 20 is stored. When the stored data is valid, the LUT 121 stores the LBA and the logical address in association with each other. When the stored data is invalid, the LUT 121 stores information indicating that a correspondence between the LBA and the logical address regarding the data is invalid. In the following description, the logical blocks in which all corresponding pages PG among the logical blocks are "invalid" may be referred to as free blocks.

A PECycle storage unit 122 stores each logical block and the number of erase operations performed for each logical block in association with each other. In the following description, the number of erase operations performed for each logical block may be referred to as a program erase cycle (PECycle). During the erase operation, the PECycle storage unit 122 is referred to, and the PECycle corresponding to the logical block with respect to which the erase operation is performed is updated. During the write operation, when a logical block for writing new data is selected, the PECycle storage unit 122 is referred to, and the free block having the smallest PECycle is selected. Further, after the erase operation is performed for the selected free block, the write operation is performed for the page PG in the memory block BLK constituting the logical block.

A memory control parameter storage unit 123 stores control parameters of the NAND memory 11. Examples of such control parameters include the read voltages $V_{CGAR}$, $V_{CGBR}$, and $V_{CGCR}$ described with reference to FIG. 3, which may be adjusted according to the elapsed time from the execution time of the erase operation or the write operation, the PECycle, and the temperature. The memory control parameter storage unit 123 may store the read voltages $V_{CGAR}$, $V_{CGBR}$, and $V_{CGCR}$, or may store the differences from initial values of the read voltages $V_{CGAR}$, $V_{CGBR}$, and $V_{CGCR}$. The control parameters may be stored, for example, in association with each logical block, in association with each memory block BLK, or in association with each word line WL (FIG. 2). Alternatively, a plurality of word lines WL may be set as a word line group and the control parameters may be stored in association with the word line group or in association with other configurations.

An ECC processing unit 124 detects an error in the data read from the NAND memory 11 during the read operation, and outputs a bit error rate (BER). In addition, the ECC processing unit 124 corrects the data, if possible, during the read operation. The ECC processing unit 124 encodes the data input from the host device 20 during the write operation. The ECC processing unit 124 may be implemented as a dedicated circuit, and not by the controller 12 and the DRAM 13.

An ECC parameter storage unit 125 stores control parameters related to operations of the ECC processing unit 124. For example, an ECC calculation method as a control parameter may indicate a BCH code and an LDPC code. For example, in order to ensure reliability of the data stored in the NAND memory 11, the data may need to be encoded by a method having a high error correction capability. However, in such a case, when encoding the data, a relatively large redundant bit may be added to the data, which may impact the storage capacity available to a user. For that reason, when deterioration of the memory cell MC does not progress so much, it may be better to encode the data by a method that requires a relatively small redundant bit. Further, when the deterioration of the memory cell MC progresses, it may be better to encode the data by a method having a higher error correction capability, which involves reduction of information bits and increase of redundant bits. The ECC parameter storage unit 125 stores, for example, a value indicating by what calculation method the ECC processing unit 124 performs the ECC process and the encoding process.

A BER storage unit 126 stores the BER output from the ECC processing unit 124.

A forced refresh counter 127 is used to adjust the execution timing of a forced refresh operation (to be described below). The forced refresh counter 127 stores a count value related to an execution unit of the forced refresh operation. The execution unit of the forced refresh operation may be, for example, a logical block, a memory block BLK, a word line group, or a word line WL. The count value is reset to an initial value when the erase operation or the write operation is performed. Further, the count value is appropriately updated according to the elapsed time from the execution time of the erase operation or the write operation, the PECycle, and the temperature. When the count value reaches a certain value, a forced refresh reservation is made.

A forced refresh reservation information storage unit 128 stores, for example, the physical address corresponding to the execution unit of the forced refresh operation, and execution timing information. For example, the scheduled execution time of the forced refresh operation or information indicating immediate execution is stored as the execution timing information. In FIG. 4, the forced refresh reservation information storage unit 128 is simply referred to as a reservation information storage unit 128.

A timer 129 stores information indicating a current time (hereinafter, referred to as "current time information"). The timer 129 receives a clock signal from the crystal oscillator 14 (FIG. 1) and appropriately updates current time information. Further, the timer 129 receives the current time information from the host device 20, and appropriately corrects the current time information in the timer 129.

A time information storage unit 130 stores time information indicating time. The time information stored in the time information storage unit 130 includes, for example, the time when the power of the memory system 10 was turned off, the execution time of the erase operation for each logical block or each memory block BLK, and the execution time of the write operation for each page PG. When the power is turned off, the voltage supplied from the power supply device 30 is cut off. When storing the execution time of the write operation, the time may be stored in association with the configuration other than the page PG.

In the present specification, each information stored in the DRAM 13 (e.g., the conversion table 120, LUT 121, PECycle, memory control parameters, control parameters related to the ECC processing unit 124, BER, count value of the forced refresh counter 127, information stored by the forced refresh reservation information storage unit 128, and time information) may be referred to as management information.

[Forced Refresh Operation]

As described with reference to FIGS. 2 and 3, the threshold voltage of the memory cell MC in the NAND memory 11 changes according to the amount of charge in the charge storage film. When a certain time elapses from the execution time of the write operation, electrons in the charge storage film may escape to a channel region, and the threshold voltage of the memory cell MC may shift to be lower. For example, when the threshold voltages of a part of the memory cells MC in the A to C states illustrated in FIG. 3 becomes lower than the read voltages $V_{CGAR}$ to $V_{CGCR}$, the data recorded in the memory cells MC is erroneously determined during the read operation.

Such a fluctuation in the threshold voltage becomes more remarkable as the temperature of the memory system 10 becomes higher. Further, such a fluctuation in the threshold voltage becomes more remarkable as the PECycle becomes larger.

To address such an issue, in the memory system 10 according to the present embodiment, data is once read from one memory block BLK in the NAND memory 11 and written to another memory block BLK according to the elapsed time from the execution time of the erase operation or the write operation, the temperature of the memory system 10, and the PECycle. The data may be written to another memory block BLK in the same NAND memory 11 or may be written to a memory block BLK in another NAND memory 11. Hereinafter, such an operation is referred to as a "forced refresh operation". According to such a method, deterioration of data may be suitably suppressed.

FIG. 5 is a table to explain a method of adjusting the execution timing of the forced refresh operation. "XX" in the figure indicates a time for updating the count value in the forced refresh counter 127 described with reference to FIG. 4 (hereinafter, referred to as an "update time").

In the example of FIG. 5, the update time is different depending on the temperature of the memory system 10 divided into the following four stages: less than A° C.; A° C. or more and less than B° C.; B° C. or more and less than C° C.; and C° C. or more. As the temperature becomes higher, the update time becomes shorter. The temperature of the memory system 10 may be acquired by the temperature sensor 15 described with reference to FIG. 1.

Further, in the example of FIG. 5, the update time is different depending on the PECycle, which is incremental by 1000 (1 K) times. The update time becomes shorter as the PECycle becomes larger. The PECycle may be acquired by the PECycle storage unit 122 described with reference to FIG. 4. The example of FIG. 5 is merely an example, and it is possible to appropriately adjust the incremental unit of the PECycle.

The controller 12 appropriately refers to, for example, the timer 129 described with reference to FIG. 4. Further, the controller 12 updates the count value in the forced refresh counter 127 at the timing when time elapsed from the execution time of the erase operation or the write operation or the previous update time of the count value reaches "XX" in FIG. 5. As described above, when the count value reaches a certain value, the forced refresh operation is reserved and stored in the forced refresh reservation information storage unit 128 of FIG. 4. Further, the memory appropriately refers to the forced refresh system 10 reservation information storage unit 128 to perform the forced refresh operation.

[Method of Adjusting the Execution Timing of the Forced Refresh Operation after Power is Turned Off]

When the memory system 10 is in a power-off state, the memory system 10 may not be able to recognize the elapsed time from the time when the power is turned off to the time of startup, and temperature. In such a case, it may not be possible to perform the forced refresh operation at an appropriate timing.

Figure 6:
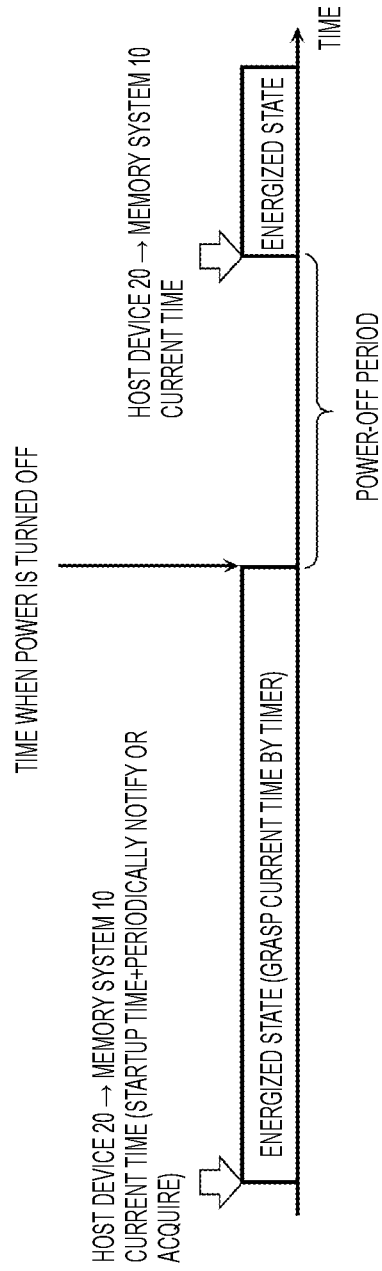
FIG. 6 is a timing chart to explain illustrating the method of adjusting the execution timing of the forced refresh operation.

To address such an issue, as illustrated in FIG. 6, the memory system 10 according to the present embodiment receives the current time information from the host device 20 at the time of startup. The current time information received from the host device 20 corresponds to a time of the vicinity of the time when the memory system 10 is started up. Further, the timer 129 (FIG. 4) updates the current time information. The time information in the timer 129 (FIG. 4) may be appropriately corrected by receiving the current time information from the host device 20. Further, when the power is turned off, the memory system 10 according to the present embodiment stores the time when the power is turned off. This makes it possible to recognize the elapsed time from the time when the power is turned off to the time when the power is started up (hereinafter, referred to as a "power-off period"). Further, the memory system 10 according to the present embodiment estimates the temperature of the memory system 10 from the time when the power was turned off to the time when the power is started up by the method described below. As a result, the execution timing of the forced refresh operation is adjusted.

Hereinafter, with reference to FIGS. 7 to 10, descriptions will be made on a method of adjusting the execution timing of the forced refresh operation after the power is turned off.

Figure 7:
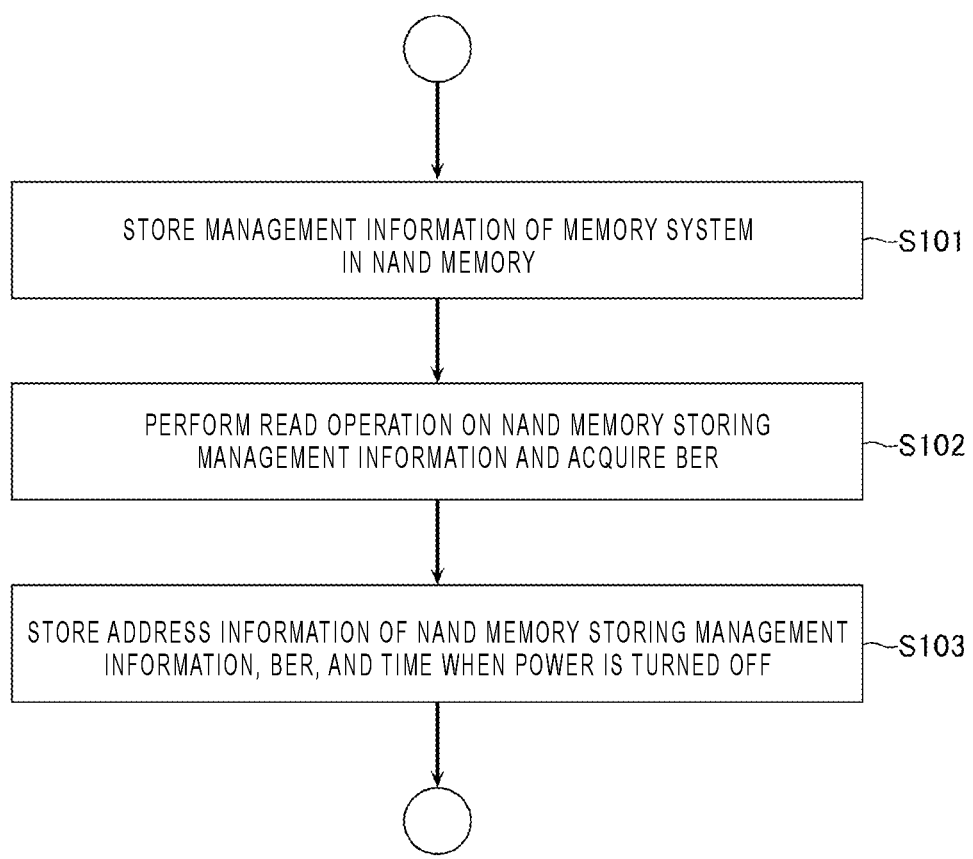
FIG. 7 is a flowchart illustrating a part of a process when a power is turned off.

First, a part of the process when the power is turned off will be described with reference to FIG. 7. FIG. 7 is a flowchart illustrating a part of the process when the power is turned off.

In S101, the controller 12 stores the management information of the memory system 10 in the NAND memory 11.

In S102, the controller 12 performs a read operation with respect to the page PG of the NAND memory 11 in which the management information is stored and acquires the BER of the page PG.

In S103, the controller 12 stores, in the NAND memory 11, the physical address of the page PG of the NAND memory 11 in which the management information is stored, the BER, and the time when the power is turned off.

Figure 8:
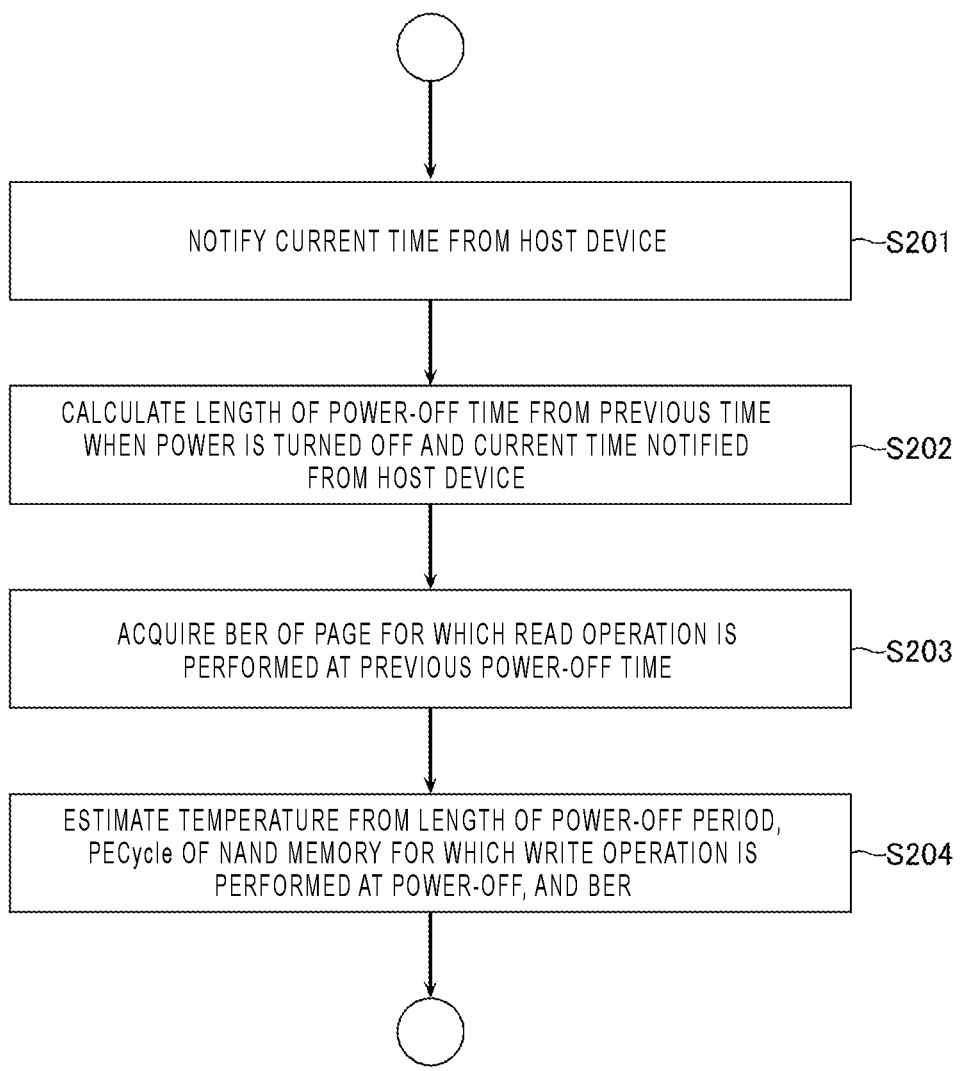
FIG. 8 is a flowchart illustrating a part of a process at the time of startup.
Figure 9:
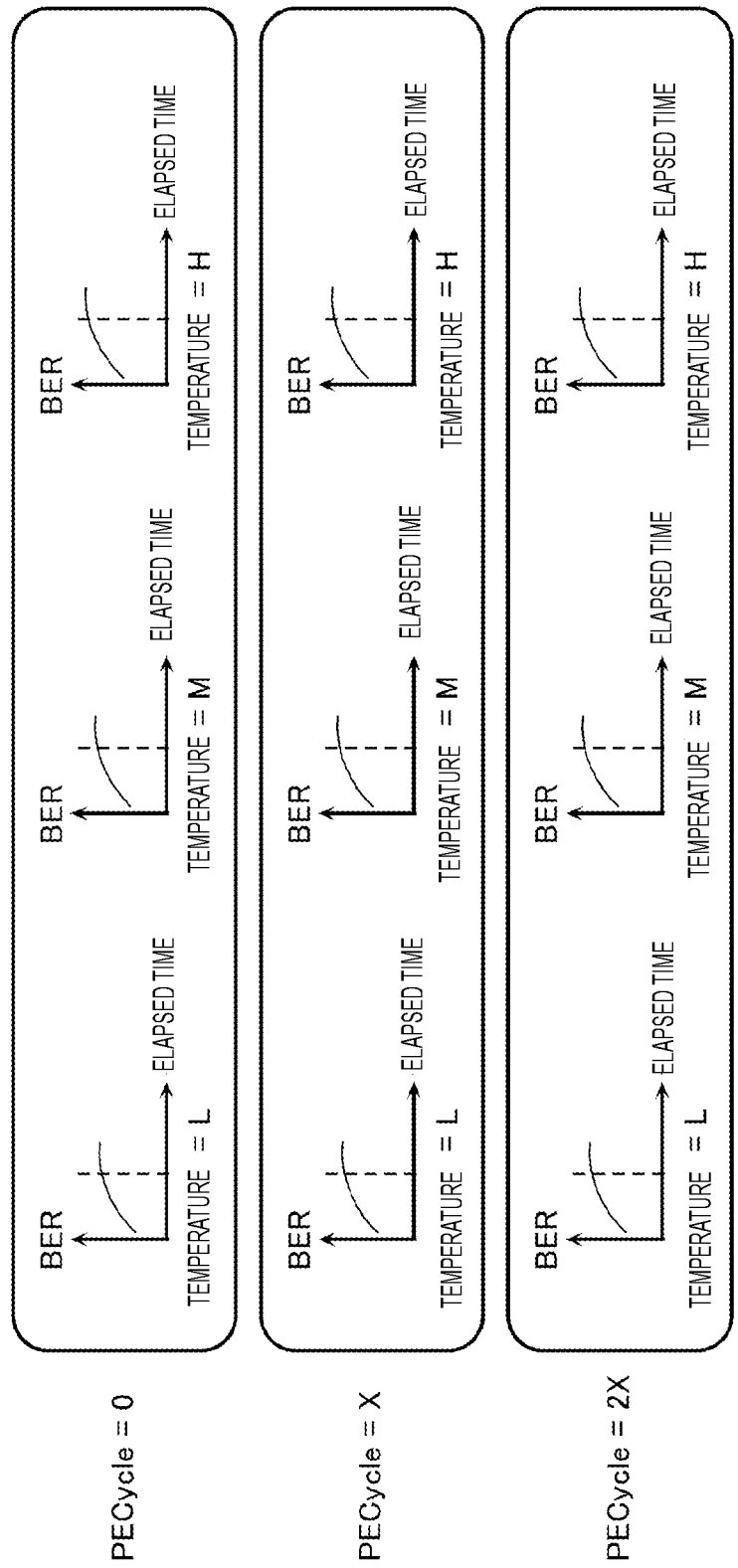
FIG. 9 is a diagram to explain a part of a process at the time of startup.

Next, a part of the process at the time of startup will be described with reference to FIGS. 8 and 9. FIG. 8 is a flowchart illustrating a part of the process at the time of startup. FIG. 9 is a diagram to explain the part of the process at the time of startup.

In S201, the controller 12 acquires the current time information from the host device 20 and stores the current time information in the timer 129 (FIG. 4).

In S202, the controller 12 acquires the time when the power was turned off, which is stored in the NAND memory 11 in S103 of FIG. 7. Further, the controller 12 acquires the power-off period (FIG. 6) by calculating a difference between the current time and the time when the power was turned off.

In S203, the controller 12 performs a read operation again on the page PG of the NAND memory 11 in which the read operation was performed in S102 of FIG. 7 and acquires the BER of the page PG.

In S204, the controller 12 develops a table indicating a relationship among the PECycle, the temperature, the elapsed time from the execution time of the write operation, and the BER in the DRAM 13, for example, as illustrated in FIG. 9. Subsequently, the controller 12 acquires the temperature from the table based on the PECycle of the memory block BLK corresponding to the page PG of the NAND memory 11 with respect to which the read operation was performed in S102 of FIG. 7, the power-off period acquired in S202 of FIG. 8, and the BER acquired in S203. The acquired temperature is estimated to be a temperature of the memory system 10 between the time when the power was turned off and the time when the power is started up.

Figure 10:
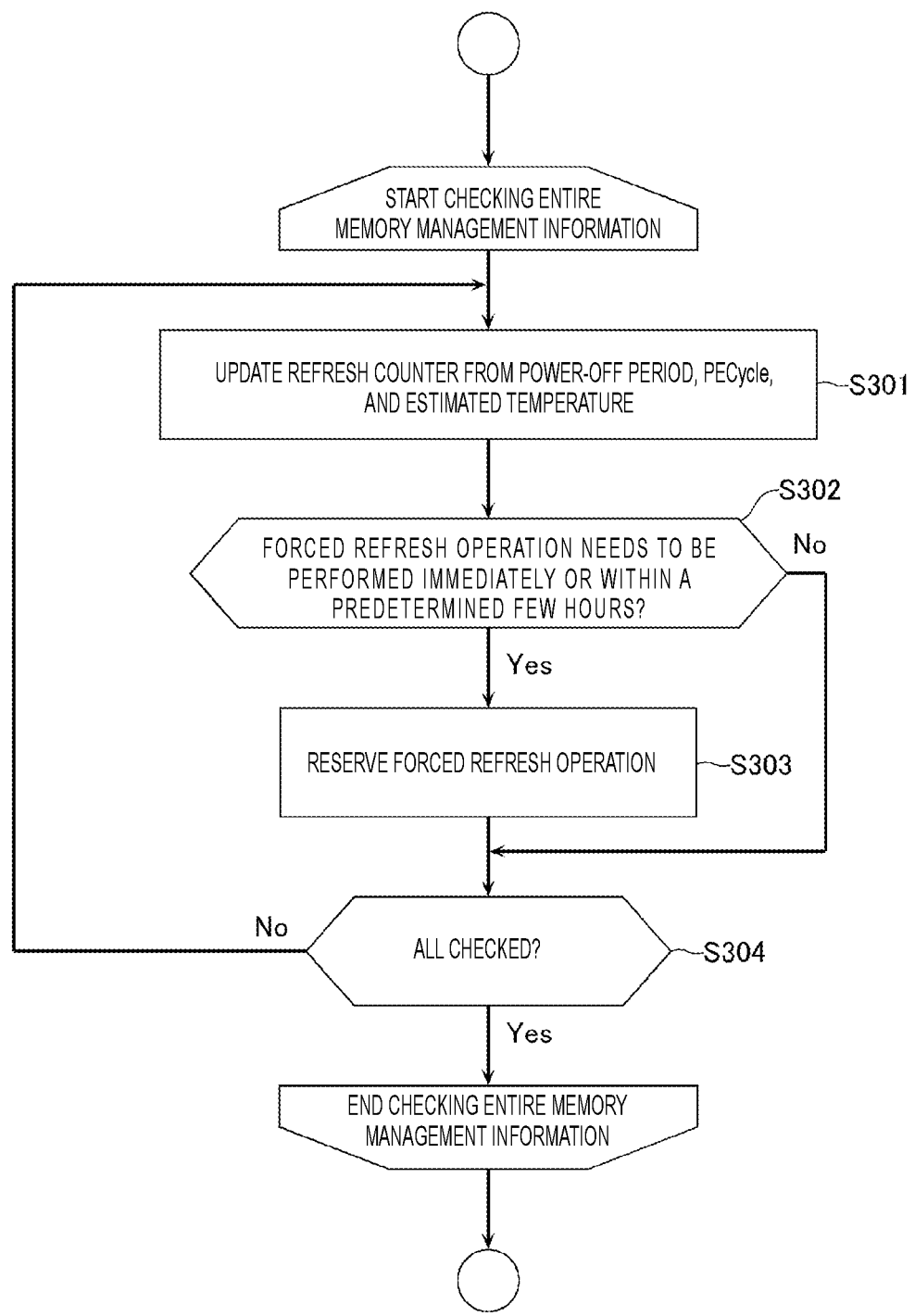
FIG. 10 is a flowchart illustrating a method of reserving the forced refresh operation.

Next, with reference to FIG. 10, description will be made on a method of reserving the forced refresh operation at the time of starting the memory system 10. FIG. 10 is a flowchart illustrating a method of reserving the forced refresh operation.

In S301, the controller 12 selects an execution unit of the forced refresh operation. Subsequently, the count value in the forced refresh counter 127 is updated based on the PECycle corresponding to the selected execution unit, the power-off period acquired in S202 of FIG. 8, and the temperature estimated in S204 of FIG. 8.

In S302, the controller 12 refers to the forced refresh counter 127 (FIG. 4) to determine whether the forced refresh operation needs to be performed immediately or within a predetermined few hours. When it is determined that the forced refresh operation needs to be performed immediately or within the predetermined few hours ("Yes" in S302), the process proceeds to S303. When it is determined that the forced refresh operation does not need to be performed immediately or within the predetermined few hours ("No" in S302), the process proceeds to S304.

In S303, the controller 12 stores the physical address corresponding to the execution unit of the forced refresh operation in the forced refresh reservation information storage unit 128 (FIG. 4). Further, when it is determined that the forced refresh operation needs to be performed immediately for the selected execution unit, the controller 12 stores information indicating immediate execution in the forced refresh reservation information storage unit 128 (FIG. 4) as the execution timing information. When it is determined that the forced refresh operation needs to be performed within the predetermined few hours, the controller 12 stores the scheduled time of the forced refresh operation in the forced refresh reservation information storage unit 128 (FIG. 4) as the execution timing information.

In S304, the controller 12 determines whether the processes of S301 and S302 have been performed for all execution units of the forced refresh operation. When it is determined that the processes have not been performed for all execution units, the process returns to S301. When it is determined that the processes have been performed for all execution units, the process ends.

In the example of FIG. 10, the controller 12 determines whether to reserve the forced refresh operation based on the PECycle, the power-off period, and the temperature estimated in S204 of FIG. 8. Alternatively, for example, one of the PECycle, the power-off period, and the temperature estimated in S204 of FIG. 8 may be omitted when determining the necessity of reserving the forced refresh operation. For example, when the power-off period is significantly long (e.g., several days), the forced refresh operation may be reserved regardless of the PECycle and the temperature.

Further, in S203 of FIG. 8, when the number of error bits exceeds a permissible amount, the BER may not be calculated.

A method described below may be considered as countermeasures in such cases. For example, in S102 of FIG. 7, the controller 12 performs a read operation and stores the read data without performing an error correction on the read data. Further, in S203 of FIG. 8, the controller 12 performs a read operation, compares the acquired data with the data acquired in S102 of FIG. 7, and detects the changed number of bits. The controller 12 estimates the BER in S203 based on the changed number of bits and the BER acquired in S102 in FIG. 7.

In addition, a method described below may be considered as other measures. For example, the controller 12 uses an error correction code over a plurality of pages PG of a plurality of NAND memories 11, for example, a Reed-Solomon (RS) code as an encoding method, thereby performing an error correction in S203 of FIG. 8. Subsequently, the controller 12 compares the corrected data with the data acquired in S102 of FIG. 7 and acquires the BER from the difference.

Second Embodiment

Next, a memory system 10 according to a second embodiment will be described. The memory system 10 according to the second embodiment is basically configured in the same manner as the memory system 10 according to the first embodiment.

Figure 11:
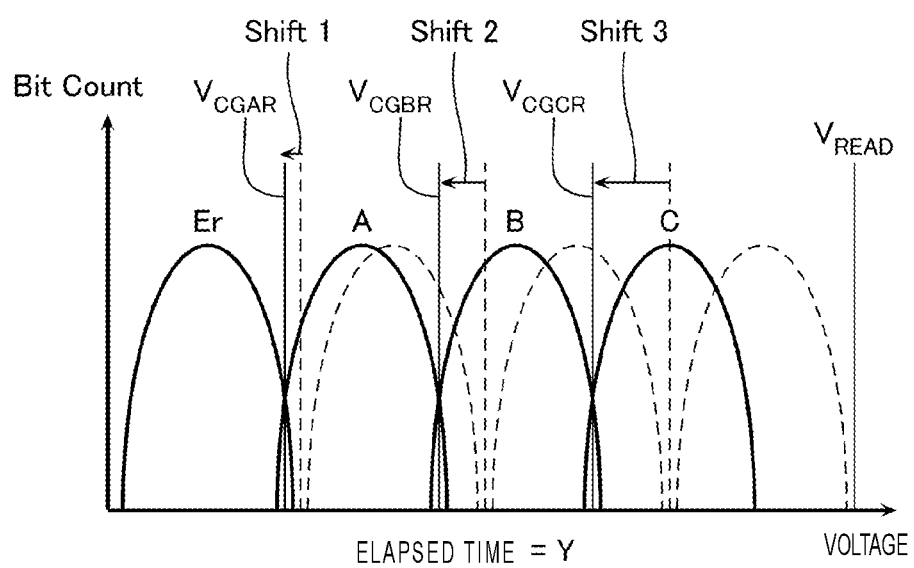
FIG. 11 is a histogram schematically illustrating a shift of a threshold voltage distribution in a second embodiment.

FIG. 11 is a histogram schematically illustrating a shift of threshold voltages of memory cells MC in the memory system 10 according to the second embodiment. As described above, after a certain amount of time has elapsed since the write operation was performed, the electrons in the charge storage film may escape to the channel region, and the threshold voltages of the memory cells MC may shift to be lower. In such a case, as illustrated in FIG. 11, the read operation may be more suitably performed by adjusting the magnitudes of the read voltages $V_{CGAR}$, $V_{CGBR}$, and $V_{CGCR}$.

To address such an issue, in the memory system 10 according to the second embodiment, the magnitudes of the read voltages $V_{CGAR}$, $V_{CGBR}$, and $V_{CGCR}$ are adjusted according to the elapsed time from the execution time of the erase operation or the write operation, the temperature of the memory system 10, and the PECycle.

In the following description, differences from the initial values of the read voltages $V_{CGAR}$, $V_{CGBR}$, and $V_{CGCR}$ may be referred to as shift values. FIG. 11 illustrates the shift values Shift 1, Shift 2, and Shift 3 corresponding to the read voltages $V_{CGAR}$, $V_{CGBR}$, and $V_{CGCR}$. In the memory system 10 according to the second embodiment, the shift values Shift 1, Shift 2, and Shift 3 are adjusted.

Figure 12:
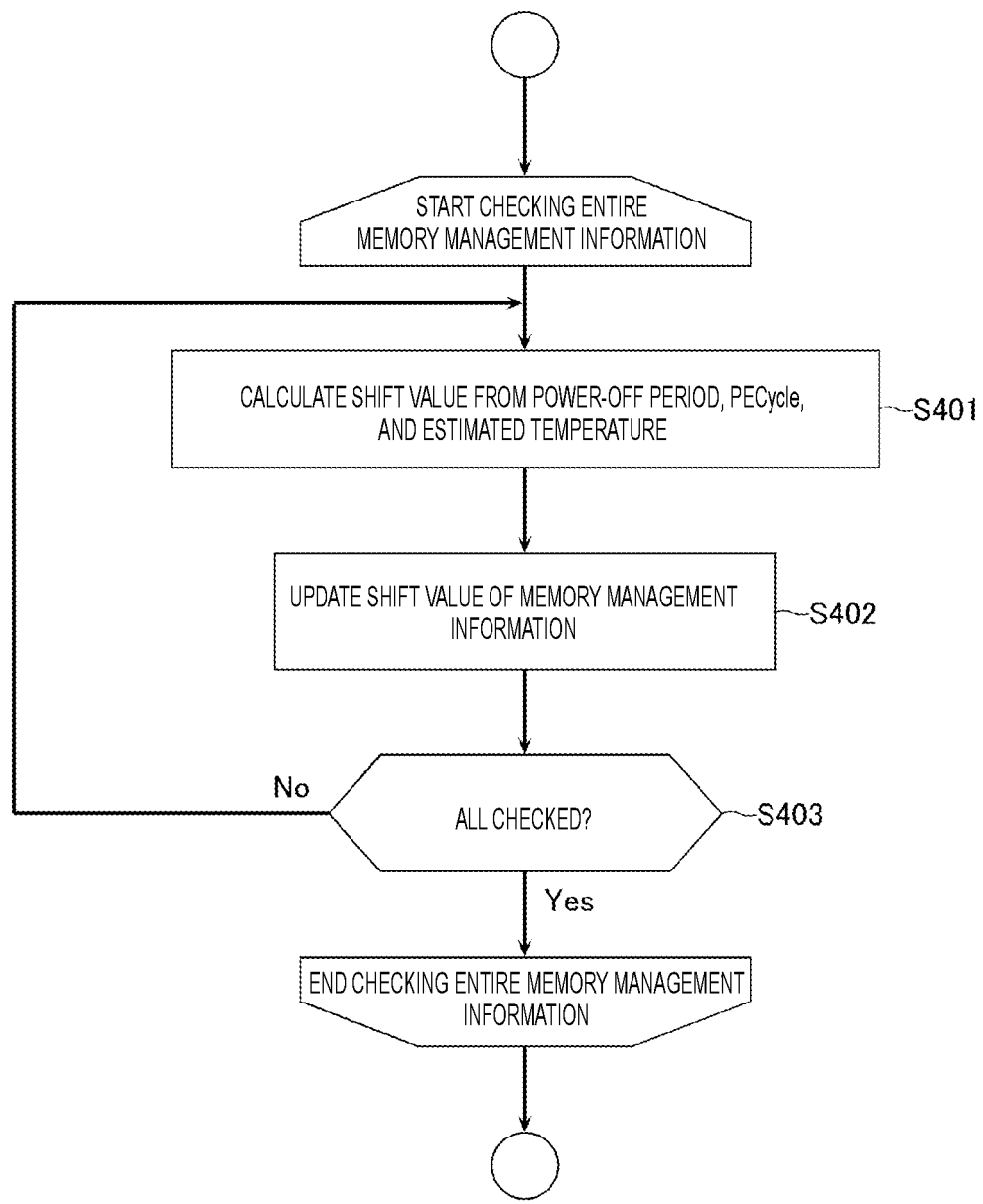
FIG. 12 is a flowchart illustrating a method of adjusting a read voltage.

Next, with reference to FIGS. 12 to 14, descriptions will be made on a method of adjusting the read voltages at the time of starting the memory system 10. FIG. 12 is a flowchart illustrating a method of adjusting the read voltages. FIGS. 13 and 14 are diagrams to further explain the method of adjusting the read voltages.

In S401, the controller 12 selects an execution unit for adjusting the read voltages. The execution unit for adjusting the read voltages may be, for example, a page PG, a word line WL, the above-mentioned word line group, a memory block BLK, or a logical block. Subsequently, the controller 12 adjusts the shift values Shift 1, Shift 2, and Shift 3 described with reference to FIG. 11 based on the PECycle corresponding to the selected execution unit, the elapsed time from the execution time of the erase operation or the write operation to the time when the power is turned off, the power-off period acquired in S202 of FIG. 8, and the temperature estimated in S204 of FIG. 8.

When adjusting the shift values Shift 1, Shift 2, Shift 3, the controller 12 develops a table indicating a relationship among the PECycle, the temperature, the shift values Shift 1, Shift 2, and Shift 3, and the elapsed time from the execution time of the erase operation or the write operation in the DRAM 13, for example, as illustrated in FIG. 13. In FIG. 13, the shift values increases as the elapsed time increases. And, as illustrated in FIG. 13, the shift values varies based on values of the PECycle and the temperature. The PECycle may be acquired from the PECycle storage unit 122 (FIG. 4). The temperature may be estimated in S204 of FIG. 8 by performing the processes of FIGS. 7 and 8. The elapsed time from the execution time of the erase operation or the write operation may be acquired from the timer 129 (FIG. 4) and the time information storage unit 130 (FIG. 4).

FIG. 14 illustrates an example in which the PECycle is X, the temperature is B, and the elapsed time from the execution time of the write operation is t1. As illustrated in FIG. 14, it is possible to acquire the shift values Shift 1, Shift 2, and Shift 3 by using the above-mentioned values.

In S402, the controller 12 stores the shift values Shift 1, Shift 2, and Shift 3 acquired in S401 in the memory control parameter storage unit 123 (FIG. 4).

In S403, the controller 12 determines whether the processes of S401 and S402 have been performed for all execution units for adjusting the read voltages. When it is determined that the processes have not been performed for all execution units, the process returns to S401. When it is determined that the processes have been performed for all execution units, the process ends.

In the example of FIG. 12, an example is illustrated in which the read voltages are adjusted for all execution units when the memory system 10 is started up. However, the read voltages may be adjusted after the memory system 10 is started up and when a read error occurs.

In such a case, for example, a "shift value addition flag" corresponding to all execution units is used as one of pieces of the above-mentioned management information. Further, when the memory system 10 is started up, the shift value addition flag corresponding to all execution units is set.

Further, in S401, when calculating the shift value, the elapsed time from the startup time to the execution time of the read operation is also used in addition to the elapsed time from the execution time of the erase operation or the write operation to the time when the power is turned off, and the power-off period acquired in S202 of FIG. 8. When acquiring the temperature, it is also possible to use the output value from the temperature sensor 15 at that time.

Further, after the end of S402, the shift value addition flag of the corresponding execution unit is removed.

Also, S403 is not performed.

Third Embodiment

Figure 15:
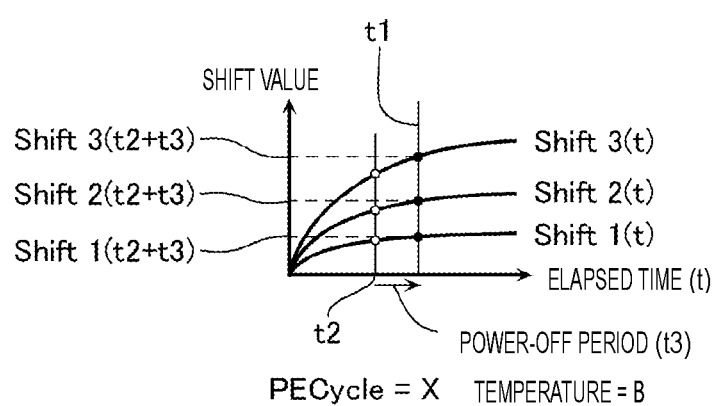
FIG. 15 is a diagram to explain an operation of a memory system according to a third embodiment.

Next, a memory system 10 according to a third embodiment will be described. FIG. 15 is a diagram to explain an operation of the memory system 10 according to the third embodiment. The memory system 10 according to the third embodiment is basically configured in the same manner as the memory system 10 according to the second embodiment.

However, the memory system 10 according to the third embodiment does not store the execution time of the erase operation or the write operation.

Further, the memory system 10 according to the third embodiment uses the table described with reference to FIG. 13 when adjusting the shift values Shift 1, Shift 2, and Shift 3 in S401 of FIG. 12. Here, the controller 12 calculates the elapsed time t2 from the execution time of the write operation based on the shift values Shift 1, Shift 2, and Shift 3 in the memory control parameter storage unit 123 (FIG. 4), the PECycle, and the temperature estimated in S204 of FIG. 8. Subsequently, the controller 12 adds a power-off period t3 to the elapsed time t2 to obtain the elapsed time t1 from the execution time of the write operation after the startup. Thus, the controller 12 adjusts the shift values Shift 1, Shift 2, and Shift 3.

Fourth Embodiment

Next, a memory system 10 according to a fourth embodiment will be described. The memory system 10 according to the fourth embodiment is basically configured in the same manner as the memory system 10 according to the first embodiment.

As described with reference to FIG. 4, the ECC processing unit 124 encodes data input from the host device 20 during the write operation. Further, when the deterioration of the memory cell MC does not progress significantly, it may be suitable to encode the data by a method that requires a relatively small redundant bit. When the deterioration of the memory cell MC progresses, it may be suitable to encode the data by a method having a high error correction capability in order to ensure the reliability of the data.

When such a selection of the encoding method according to the deterioration is adopted, it is necessary to determine the degree of deterioration of the memory cell MC. For example, as the deterioration of the memory cell MC progresses, the BER tends to increase. Therefore, the degree of deterioration of the memory cell MC may be determined based on the BER.

However, when the memory system 10 is in the power-off state for a relatively long time, the electrons in the charge storage film of the memory cell MC may escape to the channel region, and the threshold voltage of the memory cell MC may shift to be lower. In such a case, although the BER becomes larger, the memory cell MC is not deteriorated. For that reason, when writing data to such a memory cell MC, data errors may be sufficiently corrected with the relatively small redundant bit.

In view of such a perspective, in the fourth embodiment, when the memory system 10 is started, the data encoding method is selected by referring not only to the BER but also to the power-off period.

For example, it is determined whether the BER acquired in S203 of FIG. 8 is smaller than a threshold value BER. When it is determined that the BER is smaller than the threshold value BER, a method that requires a relatively small redundant bit is selected as the encoding method.

When it is determined that the BER is not smaller than the threshold value BER, it is determined whether the power-off period acquired in S202 of FIG. 8 is larger than a threshold time. When it is determined that the power-off period is larger than the threshold time, the forced refresh operation is reserved, and a method that requires a relatively small redundant bit is selected as the encoding method. When it is determined that the power-off period is not larger than the threshold time, a method having a high error correction capability is selected as the encoding method.

According to such a procedure, it is possible to more suitably determine the degree of deterioration of the memory cell MC as compared with the determination based only on the BER. As a result, it is possible to minimize the impact on the storage capacity while ensuring the reliability of the data.

Fifth Embodiment

Next, a memory system 10 according to a fifth embodiment will be described. FIG. 16 is a table to explain an operation of the memory system 10 according to the fifth embodiment. The memory system 10 according to the fifth embodiment is basically configured in the same manner as the memory system 10 according to the first embodiment.

In order to store data more reliably, the above-mentioned forced refresh operation may be performed. However, during the execution of the forced refresh operation described above, execution of read operations requested by the user may be hindered.

In the memory system 10, the amount of input/output data from the host device 20 may vary significantly depending on the day of the week and the time zone. For example, in the example of FIG. 16, on weekdays other than Wednesday, the amount of input/output data is relatively large between 9:00 and 18:59, there is almost no input/output data between 0:00 and 0:59, and the amount of input/output data is relatively small at other times. In addition, although Wednesday is almost the same as other weekdays, the amount of input/output data is relatively small between 18:00 and 18:59. Further, on Saturday and Sunday, the amount of input/output data is relatively small between 9:00 and 19:59, and there is almost no input/output data at other times.

In view of such a perspective, in the memory system 10 according to the fifth embodiment, as illustrated in FIG. 16, the tendency of the amount of input/output data that varies depending on the day of the week and the time zone is acquired, and the forced refresh operation may be performed in a time zone in which the amount of input/output data is relatively small or in a time zone in which there is almost no input/output data. The data illustrated in FIG. 16 may be acquired by aggregating the amount of input/output data in the memory system 10 or may be acquired from the outside of the memory system 10. Further, in the example of FIG. 16, the amount of input/output data is divided into three levels, but the amount of input/output data may be divided into any applicable number of levels.

Figure 17:
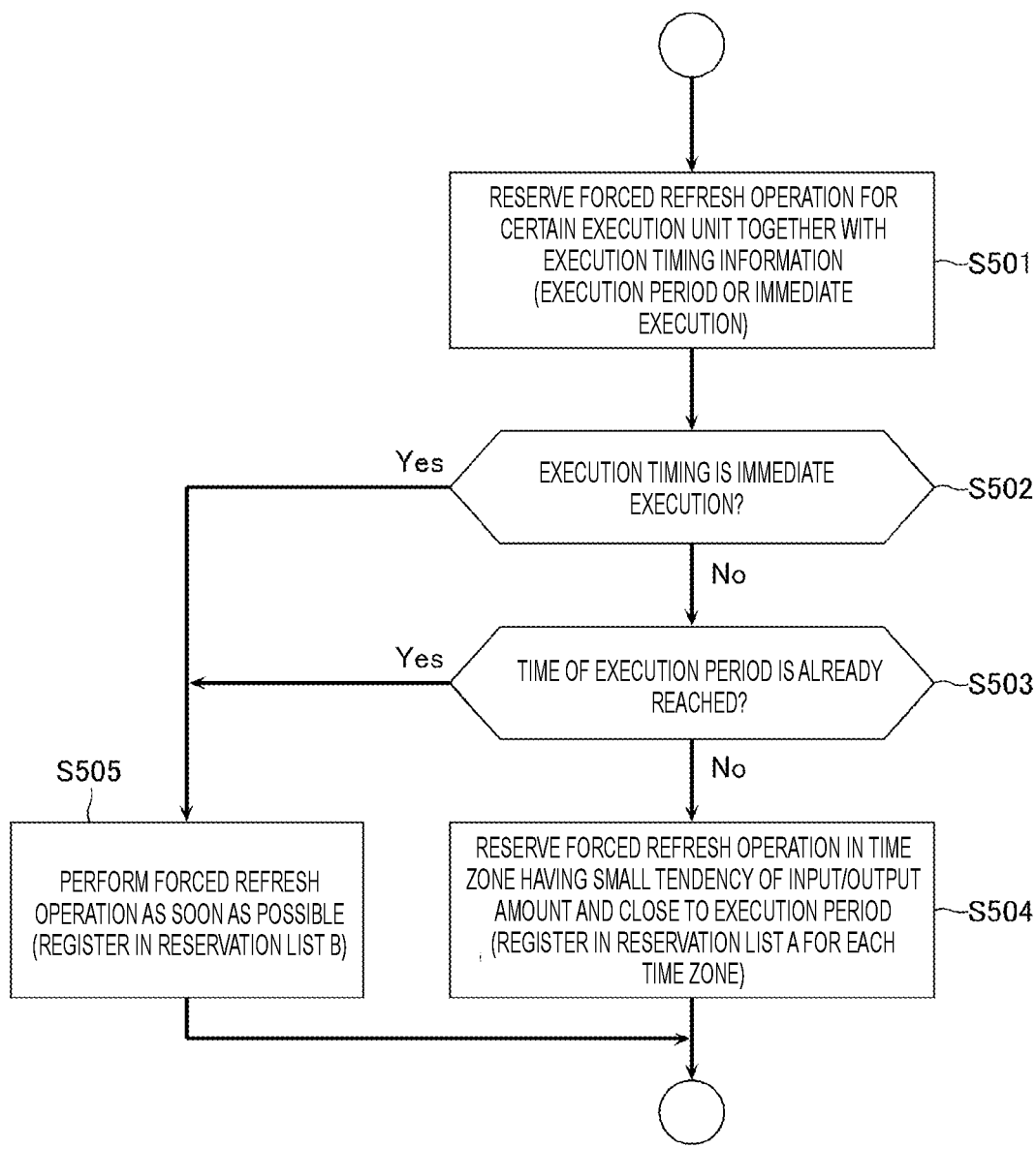
FIG. 17 is a flowchart illustrating the operation of the memory system according to the fifth embodiment.

Next, with reference to FIG. 17, descriptions will be made on a method of adjusting the execution timing of the forced refresh operation. FIG. 17 is a flowchart illustrating a method of adjusting the execution timing of the forced refresh operation.

In S501, the controller 12 selects the execution unit of the forced refresh operation. Subsequently, the controller 12 stores the physical address corresponding to the execution unit of the forced refresh operation in the forced refresh reservation information storage unit 128 (FIG. 4). Further, the controller 12 refers to the forced refresh counter 127 (FIG. 4) to determine whether the forced refresh operation needs to be performed immediately or within a predetermined few hours. When it is determined that the forced refresh operation needs to be performed immediately for the selected execution unit, the controller 12 stores the information indicating immediate execution in the forced refresh reservation information storage unit 128 (FIG. 4) as execution timing information. When it is determined that the forced refresh operation needs to be performed within the predetermined few hours, the controller 12 stores the scheduled time of the forced refresh operation in the forced refresh reservation information storage unit 128 (FIG. 4) as execution timing information.

In S502, the forced refresh reservation information storage unit 128 (FIG. 4) is referred to, and it is determined whether the information indicating immediate execution is stored for the selected execution unit. When it is determined that the information is not stored, the process proceeds to S503. When it is determined that the information is stored, the process proceeds to S505.

In S503, the forced refresh reservation information storage unit 128 (FIG. 4) is referred to, and it is determined whether the current time has reached the scheduled execution time for the selected execution unit. When it is determined that the scheduled execution time has not been reached, the process proceeds to S504. When it is determined that the scheduled execution time has been reached, the process proceeds to S505.

In S504, the controller 12 registers information on the selected execution unit (e.g., a physical address) in a reservation list A. The forced refresh operation for the execution unit registered in the reservation list A is performed in a time zone in which the amount of input/output data is relatively small or a time zone in which there is almost no input/output data based on, for example, the information as described with reference to FIG. 16.

In S505, the controller 12 registers information on the selected execution unit (e.g., a physical address) in a reservation list B. The forced refresh operation for the execution unit registered in the reservation list B is performed as soon as possible regardless of, for example, the information as described with reference to FIG. 16. For example, the forced refresh operation for the execution unit registered in the reservation list B may be performed in a time zone in which the amount of input/output data is relatively large.

Sixth Embodiment

Next, a memory system 10 according to a sixth embodiment will be described. The memory system 10 according to the sixth embodiment is basically configured in the same manner as the memory system 10 according to the fifth embodiment.

In the memory system 10 according to the fifth embodiment, as illustrated in FIG. 16, the tendency of the amount of input/output data from the host device 20 that varies depending on the day of the week and the time zone is acquired, and the forced refresh operation may be performed in a time zone in which the amount of input/output data is relatively small or in a time zone in which there is almost no input/output data. However, such an operation may be applied not only to the forced refresh operation but also to other background processes. Examples of such background processes include a garbage collection and the like.

In view of such a perspective, in the memory system 10 according to the sixth embodiment, the data as illustrated in FIG. 16 is used to adjust the execution timing of the background process once a day at a specific time.

Figure 18:
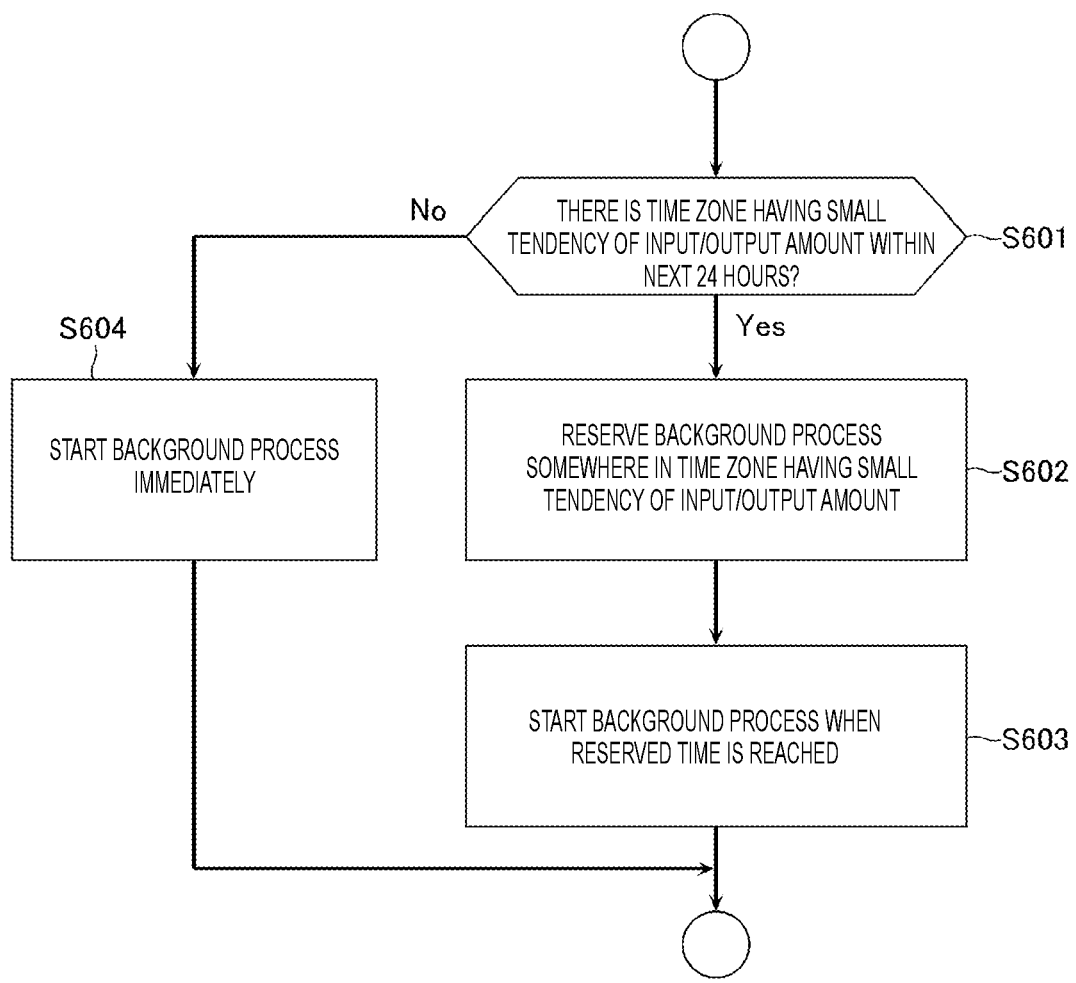
FIG. 18 is a flowchart illustrating an operation of a memory system according to a sixth embodiment.

Next, with reference to FIG. 18, descriptions will be made on a method of controlling the execution timing of the background process. FIG. 18 is a flowchart illustrating a method of controlling the execution timing of the background process.

In S601, the controller 12 refers to the data as illustrated in FIG. 16 to determine whether there is a time zone in which the amount of input/output data is relatively small or a time zone in which there is almost no input/output data within the next 24 hours. When it is determined that there is any time zone, the process proceeds to S602. When it is determined that there is not any time zone, the process proceeds to S604.

In S602, the controller 12 reserves the execution of background process somewhere in a time zone in which the amount of input/output data is relatively small or in a time zone in which there is almost no input/output data.

In S603, the controller 12 performs the reserved background process when the reserved time zone in S602 is reached.

In S604, the controller 12 immediately performs the background process regardless of the information as described with reference to FIG. 16.

FIG. 18 illustrates an example of the method for adjusting the execution timing of the background process. However, such a method may be adjusted as appropriate.

For example, the method illustrated in FIG. 18 is assumed to be performed once a day at a specific time. However, such a method is merely an example. For example, the execution timing of the background process may be adjusted to a specific time on a specific day of the week once a week. In such a case, in S601, it is determined whether there is a day of the week or a time zone in which the amount of input/output data is relatively small or in which there is almost no input/output data within the next week, not within the next 24 hours.

OTHER EMBODIMENTS

The memory systems 10 according to the first to sixth embodiments may be configured to execute the same operations as the memory systems 10 according to the other embodiments. For example, the memory system 10 according to the first embodiment may be configured to execute the same operations as the memory systems 10 according to the third embodiment, the fourth embodiment, and the sixth embodiment.

Further, in the memory systems 10 according to the fifth and sixth embodiments, it is not necessary to use the data as illustrated in FIG. 16. In such a case, the user may be configured to specify at least one of the day of the week and the time zone in which at least one of the forced refresh operation and other background process may be performed preferentially.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
    a non-volatile memory including a first memory cell unit, a second memory cell unit, and a third memory cell unit; and
    a controller connectable to a host, the controller being configured to:
        store a value corresponding to an elapsed time from an execution of an erase operation or a write operation with respect to the first memory cell unit;
        store a power-off time of the memory system when the memory system is powered off;
        receive from the host power-on time information indicating a power-on time of the memory system when the memory system is powered on;
        determine a power-off period during which the memory system is being powered off based on the stored power-off time and the power-on time;
        update the stored value based on a value corresponding to an elapsed time from an execution of a last erase or write operation with respect to the first memory cell unit and the determined power-off period;
        count a number of times the erase operation has been executed with respect to the first memory cell unit;
        write data to the third memory cell unit before power off;
        acquire first bit error rates by reading the data from the third memory cell unit before the power off;
        store the first bit error rates before the power off;
        in response to power on after the power off, acquire second bit error rates by reading the data from the third memory cell unit;
        estimate a temperature of the memory system while being in powered off based on the stored first bit error rates, the counted number of times, the acquired second bit error rates, and the determined power-off period;
        determine an execution time of a refresh operation of transferring data stored in the first memory cell unit to the second memory cell unit based on the updated value, the counted number of times, and the estimated temperature; and
        start the refresh operation at the determined execution time.

2. The memory system according to claim 1, wherein the controller is further configured to determine the execution time of the refresh operation in response to the updated value reaches a certain value.

3. The memory system according to claim 1, wherein the controller is further configured to determine the execution time of the refresh operation to be a first time when the counted number of times is a first value, and to be a second time later than the first time when the counted number of times is a second value less than the first value.

4. The memory system according to claim 1, further comprising:
    a temperature sensor, wherein the controller is further configured to:
        acquire data indicating temperature from the temperature sensor; and
        determine the execution time of the refresh operations also based on the temperature indicated by the acquired data.

5. The memory system according to claim 4, wherein the controller is further configured to determine the execution time of the refresh operation to be a first time when the temperature is a first temperature, and to be a second time later than the first time when the temperature is a second temperature less than the first temperature.

6. The memory system according to claim 1, wherein the controller is further configured to determine the execution time of the refresh operation to be a first time when the estimated temperature is a first temperature, and to be a second time later than the first time when the estimated temperature is a second temperature less than the first temperature.

7. The memory system according to claim 1, wherein the controller is further configured to:
    store management information including the execution time of the write and erase operations and the power-off time in the third memory cell unit before the power off;
    read the management information from the third memory cell unit upon the memory system being powered on.

8. The memory system according to claim 1, wherein the controller is further configured to:
    acquire statistic data indicating amount of access to the memory system by time interval during a day and/or a week; and
    determine the execution time of the refresh operation also based on the acquired statistic data.

* * * * *